(12) United States Patent
Yang et al.

(10) Patent No.: US 12,309,963 B2
(45) Date of Patent: May 20, 2025

(54) ELECTRONIC DEVICE ASSEMBLY, EXPANSION COMPONENT THEREOF, AND HEAT DISSIPATION MODULE

(71) Applicant: Getac Technology Corporation, New Taipei (TW)

(72) Inventors: Jui-Lin Yang, Taipei (TW); Wan-Lin Hsu, Taipei (TW); Hsin-Chih Chou, Taipei (TW); Kun-Cheng Lee, Taipei (TW); Juei-Chi Chang, Taipei (TW)

(73) Assignee: Getac Technology Corporation, New Taipei (TW)

( * ) Notice: Subject to any disclaimer, the term of this patent is extended or adjusted under 35 U.S.C. 154(b) by 170 days.

(21) Appl. No.: 18/164,922

(22) Filed: Feb. 6, 2023

(65) Prior Publication Data

US 2023/0276596 A1 Aug. 31, 2023

Related U.S. Application Data

(60) Provisional application No. 63/309,463, filed on Feb. 11, 2022, provisional application No. 63/351,422, filed on Jun. 12, 2022.

(30) Foreign Application Priority Data

Nov. 22, 2022 (CN) .......................... 202211467557.7

(51) Int. Cl.
*H05K 7/20* (2006.01)
*G06F 1/16* (2006.01)
*G06F 1/20* (2006.01)

(52) U.S. Cl.
CPC ....... *H05K 7/20154* (2013.01); *G06F 1/1632* (2013.01); *G06F 1/203* (2013.01)

(58) Field of Classification Search
CPC .. H05K 7/20136–20172; G06F 1/1632; G06F 1/203
See application file for complete search history.

(56) References Cited

U.S. PATENT DOCUMENTS

| 5,784,253 A | 7/1998 | Ooka et al. |
| 7,215,543 B2 | 5/2007 | Arbogast et al. |
| 9,304,546 B2 | 4/2016 | Huang |

(Continued)

FOREIGN PATENT DOCUMENTS

| CN | 205082113 U | 3/2016 |
| CN | 209962173 U | 1/2020 |

(Continued)

*Primary Examiner* — Jacob R Crum
(74) *Attorney, Agent, or Firm* — Troutman Pepper Locke LLP; Tim Tingkang Xia, Esq.

(57) ABSTRACT

A heat dissipation module includes a diversion case and a fan. The diversion case includes an input section, an output section, and a connecting section that connects the input section and the output section, where an angle is defined between an extending direction of the input section and an extending direction of the output section, and an end of the input section away from the connecting section and an end of the output section away from the connecting section are respectively inclined relative to the connecting section. The fan is accommodated in the connecting section. An electronic device assembly includes an expansion component and the heat dissipation module.

17 Claims, 14 Drawing Sheets

(56) References Cited

U.S. PATENT DOCUMENTS

| | | |
|---|---|---|
| 9,795,044 B2 | 10/2017 | Lai et al. |
| 10,468,812 B1 | 11/2019 | Lee et al. |
| 2002/0105783 A1 | 8/2002 | Kitahara |
| 2007/0193720 A1 | 8/2007 | Horng et al. |
| 2011/0075360 A1* | 3/2011 | Tomioka ............ H05K 7/20336 361/695 |
| 2015/0195952 A1* | 7/2015 | Tsunoda ................. G06F 1/203 361/690 |
| 2017/0168531 A1 | 6/2017 | Casparian |
| 2018/0027672 A1* | 1/2018 | Cho ..................... H10K 59/871 361/697 |
| 2018/0260003 A1* | 9/2018 | Honma ................ G06F 1/1698 |
| 2019/0133000 A1* | 5/2019 | Saido ................ H05K 7/20163 |
| 2019/0346893 A1 | 11/2019 | Dillow et al. |
| 2020/0285819 A1 | 9/2020 | Haertel et al. |
| 2021/0068311 A1 | 3/2021 | Zhong |

FOREIGN PATENT DOCUMENTS

| | | |
|---|---|---|
| TW | 397225 U | 7/2000 |
| TW | 506555 U | 10/2002 |
| TW | 516662 U | 1/2003 |
| TW | M259198 U | 3/2005 |
| TW | M386520 U1 | 8/2010 |
| TW | 201213666 A1 | 4/2012 |
| TW | M550838 | 10/2017 |
| TW | M550838 U | 10/2017 |
| TW | M593578 U | 4/2020 |
| WO | 2015/126270 A1 | 8/2015 |
| WO | 2021/185018 A1 | 9/2021 |

\* cited by examiner

ELECTRONIC DEVICE ASSEMBLY, EXPANSION COMPONENT THEREOF, AND HEAT DISSIPATION MODULE

CROSS-REFERENCES TO RELATED APPLICATIONS

This application claims the benefit of U.S. provisional application Ser. No. 63/309,463, filed on Feb. 11, 2022, U.S. provisional application Ser. No. 63/351,422, filed on Jun. 12, 2022, and claims the priority of Patent Application No. 202211467557.7 filed in China, P.R.C. on Nov. 22, 2022. The entirety of the above-mentioned patent applications are hereby incorporated by references herein and made a part of the specification.

BACKGROUND OF THE INVENTION

The present invention relates to an electronic device assembly, an expansion component thereof, and a heat dissipation module.

With the popularization of electronic products, users have increasingly diversified requirements for the performance of electronic devices. To meet various requirements of the users, a quantity of electronic components in the electronic device is increasing, which also causes problems of space configuration and heat dissipation in the electronic device. How to increase configurations of the electronic components in a limited space of the electronic device to improve efficiency while taking into account a heat dissipation effect is a problem that the inventors are urgently trying to resolve.

SUMMARY OF THE INVENTION

The present invention further provides an expansion component, including a case, a partition, a plurality of electronic components, and a heat dissipation module. The case includes a bottom plate, a top plate, and an accommodating space located between the bottom plate and the top plate. The partition is arranged in the accommodating space and parallel to the bottom plate, and the partition divides the accommodating space into an upper compartment and a lower compartment. The electronic components are scattered in the upper compartment and the lower compartment, where one of the electronic components located in the upper compartment abuts against the partition. The heat dissipation module is arranged in the case and includes a flow guide case and a fan. The flow guide case includes an input section and an output section that are connected, an angle is defined between an extending direction of the input section and an extending direction of the output section, the flow guide case is accommodated in the lower compartment, and the output section abuts against the partition and one of the electronic components located in the lower compartment. The fan is arranged at a junction of the input section and the output section.

In some embodiments, the bottom plate includes through holes, and the flow guide case includes an edge, the edge surrounds and forms an opening, the edge abuts against the bottom plate, and the opening covers the through holes.

In some embodiments, the through holes include first through holes and second through holes, the first through holes correspond to a position of the input section, and the second through holes correspond to a position of the output section.

In some embodiments, the flow guide case includes an inner surface, the inner surface faces toward the bottom plate, the output section includes a first heat dissipation section and a second heat dissipation section, the inner surface has a first height between the first heat dissipation section and the opening, the inner surface has a second height between the second heat dissipation section and the opening, and the first height is different from the second height.

In some embodiments, the expansion component further includes heat dissipation fins that are arranged on the first heat dissipation section and the second heat dissipation section.

In some embodiments, the first heat dissipation section abuts against the electronic component located in the lower compartment, and the second heat dissipation section abuts against a position at which the partition corresponds to the electronic component located in the upper compartment.

In some embodiments, the first heat dissipation section is farther away from the fan than the second heat dissipation section, and the first height is less than the second height.

In some embodiments, the inner surface is inclined to the bottom plate in an extending direction between the first heat dissipation section and the second heat dissipation section.

In some embodiments, the output section further includes a third heat dissipation section, the inner surface has a third height between the third heat dissipation section and the opening, and the third height is different from the first height and the second height.

In some embodiments, the third heat dissipation section is closer to the fan than the first heat dissipation section and the second heat dissipation section, and the third heat dissipation section abuts against another electronic component located in the lower compartment.

In some embodiments, the third heat dissipation section is flush with the fan, and the third height is greater than the first height and less than the second height.

In some embodiments, the input section of the flow guide case includes an inlet section, the inlet section has a first end and a second end, the inner surface is inclined to the bottom plate at the inlet section, the second end is closer to the fan than the first end, and a height of the inner surface from the second end to the opening is greater than a height of the inner surface from the first end to the opening.

In some embodiments, the expansion component further includes heat dissipation fins that are arranged on the inlet section.

In some embodiments, the input section of the flow guide case further includes a collecting section, the collecting section is located between the inlet section and the fan, the inner surface has the second height from the collecting section to the opening, and the collecting section abuts against the partition.

In some embodiments, the fan includes a case, the case is provided with an air inlet and an air outlet that are perpendicular to each other, the air inlet faces toward the inner surface and is spaced apart from the inner surface by a distance, and the air outlet faces toward the output section.

In some embodiments, the inner surface has the second height from the fan to the opening.

In some embodiments, the angle is 90 degrees.

The present invention provides another expansion component, including a case, a partition, a plurality of electronic components, and a heat dissipation module. The case includes a bottom plate, a top plate, and an accommodating space located between the bottom plate and the top plate. The partition is arranged in the accommodating space and parallel to the bottom plate, and the partition divides the accommodating space into an upper compartment and a lower compartment. The electronic components are scattered in the upper compartment and the lower compartment, where one of the electronic components located in the upper compartment abuts against the partition. The heat dissipation module is arranged in the case and includes a flow guide case and a fan. The flow guide case includes an input section and an output section that are connected to form an L-shape, where the flow guide case is accommodated in the lower compartment and fixed to the bottom plate, and the output section abuts against the partition and one of the electronic components located in the lower compartment. The fan is arranged at a junction of the input section and the output section.

The present invention further provides an electronic device assembly, including an expansion component and a host. The expansion component includes a first case, a partition, a plurality of electronic components, a heat dissipation module, and a first connector. The host includes a second case, a main circuit board, and a main connector. The first case includes a bottom plate, a top plate, and a first accommodating space located between the bottom plate and the top plate, where the top plate is provided with an opening. The partition is arranged in the first accommodating space and parallel to the bottom plate, and the partition divides the first accommodating space into an upper compartment and a lower compartment. The electronic components are scattered in the upper compartment and the lower compartment, where one of the electronic components located in the upper compartment abuts against the partition. The heat dissipation module is arranged in the case and includes a flow guide case and a fan. The flow guide case includes an input section and an output section that are connected to form an L-shape, where the flow guide case is accommodated in the lower compartment and fixed to the bottom plate, and the output section abuts against the partition and one of the electronic components located in the lower compartment. The fan is arranged at a junction of the input section and the output section. The first connector is electrically connected to the first circuit board and exposed from the top plate at the opening. The second case has a second accommodating space. The main circuit board is accommodated in the second accommodating space. The main connector is electrically connected to the main circuit board and the main connector is arranged on a surface of the second case, where after the host is assembled to the expansion component, the second case covers the top plate of the first case and the opening, and the first connector is electrically connected to the main connector.

The present invention further provides a heat dissipation module, including a flow guide case and a fan. The flow guide case includes an input section, an output section, and a connecting section that connects the input section and the output section, where an angle is defined between an extending direction of the input section and an extending direction of the output section, and an end of the input section away from the connecting section and an end of the output section away from the connecting section are respectively inclined relative to the connecting section. The fan is accommodated in the connecting section.

DETAILED DESCRIPTION OF THE INVENTION

Figure 1:
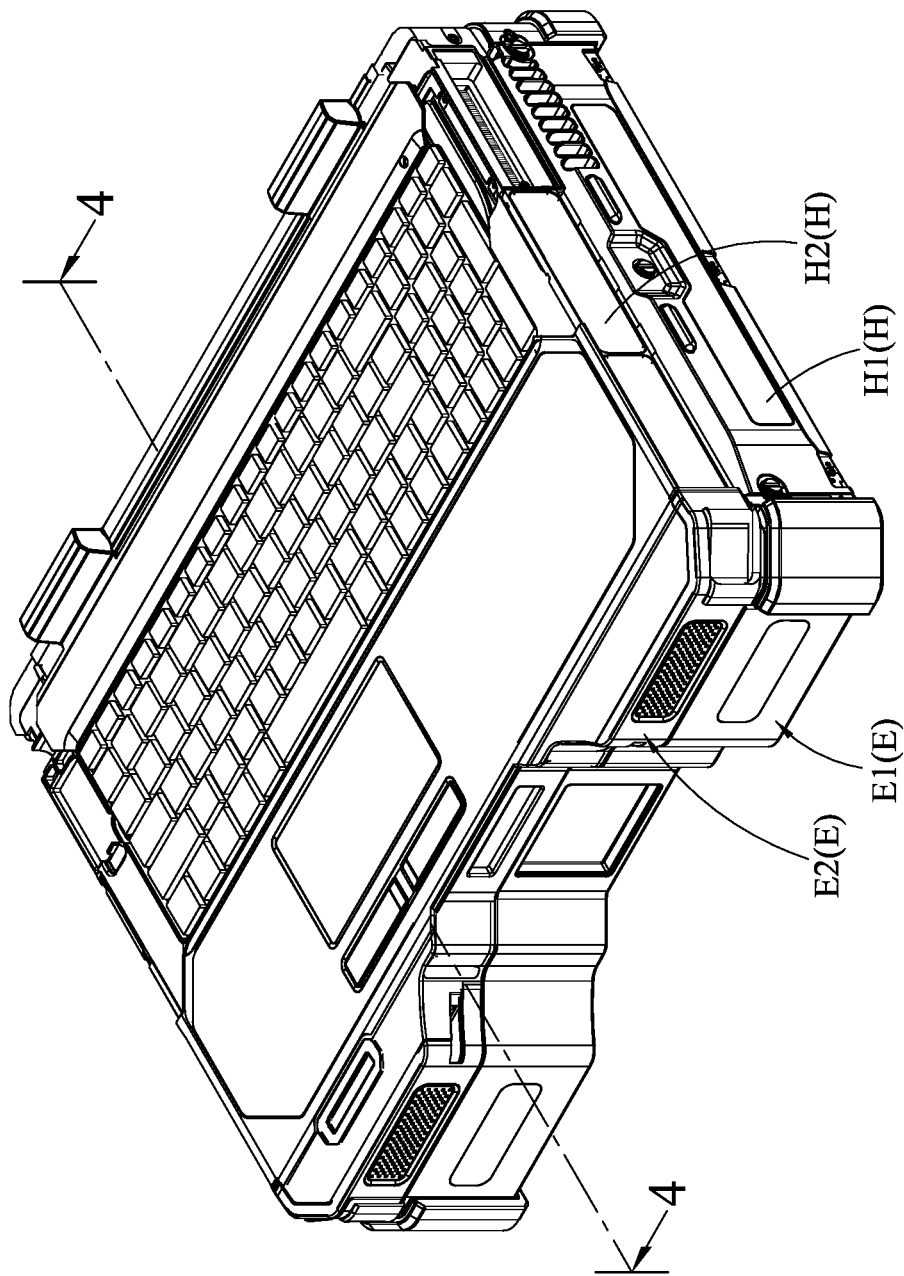
FIG. 1 is a schematic three-dimensional external view of an embodiment of an electronic device assembly according to the present invention.
Figure 2:
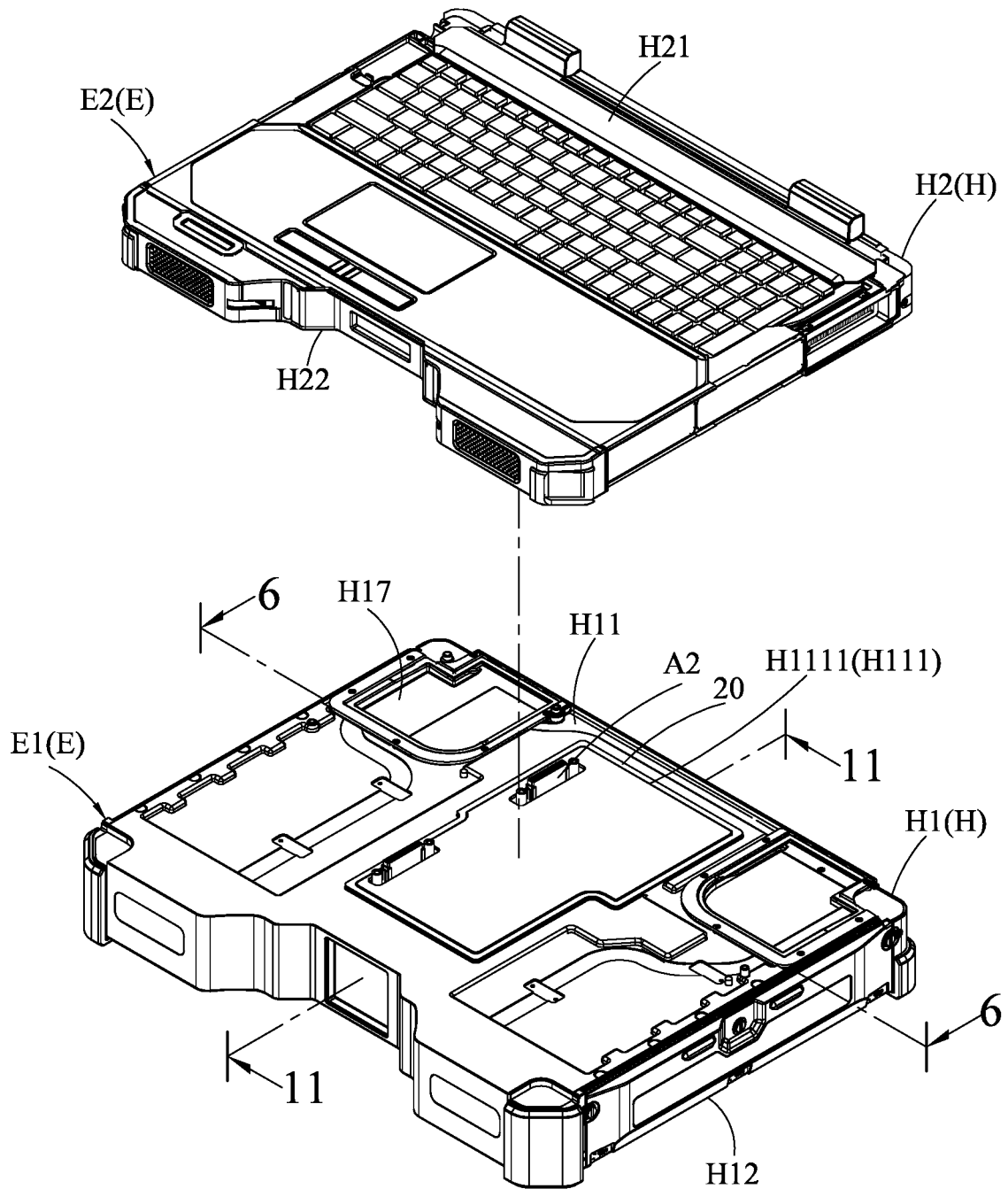
FIG. 2 is a first schematic three-dimensional exploded diagram of an embodiment of an electronic device assembly according to the present invention.
Figure 3:
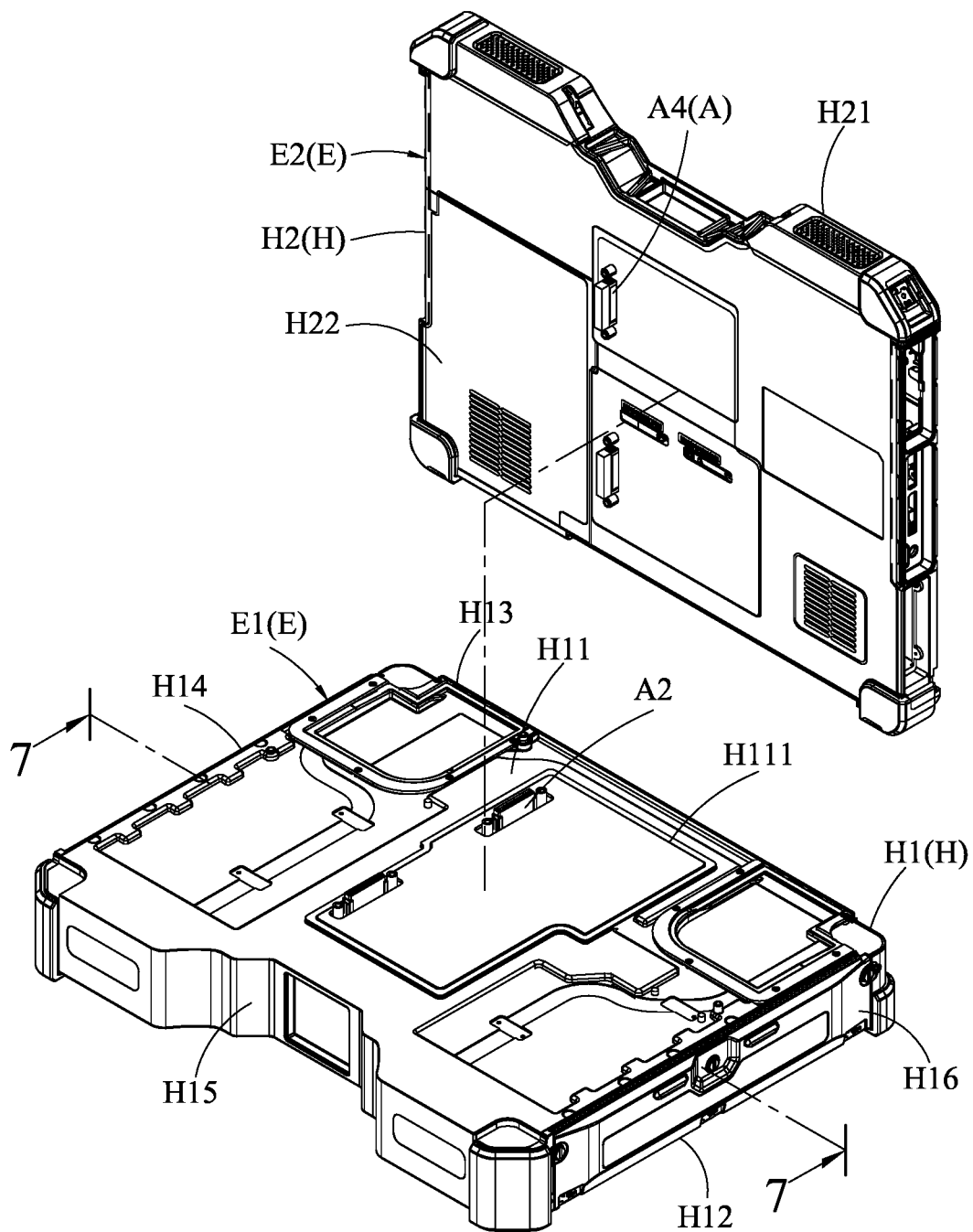
FIG. 3 is a second schematic three-dimensional exploded diagram of an embodiment of an electronic device assembly according to the present invention.
Figure 4:
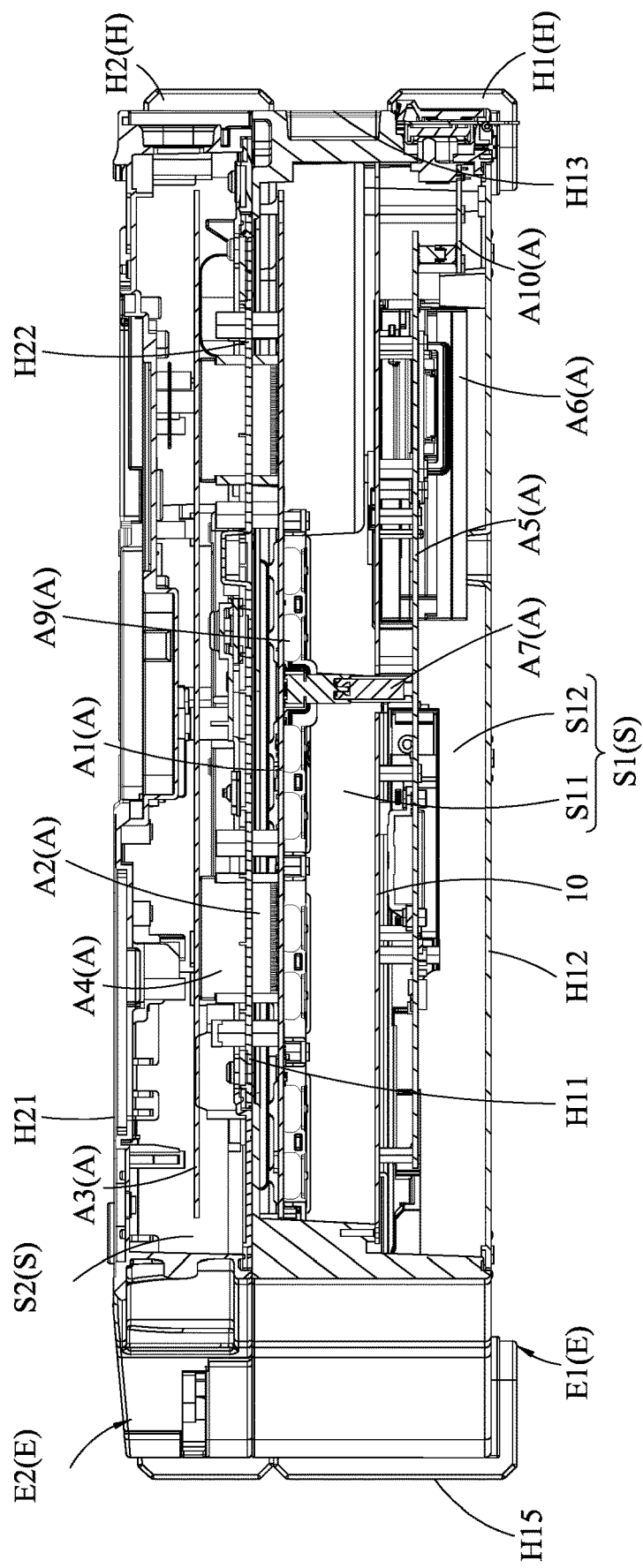
FIG. 4 is a schematic cross-sectional view drawn along a division line 4-4 in FIG. 1.

Referring to FIG. 1 to FIG. 4, FIG. 1 is a schematic three-dimensional external view of an embodiment of an electronic device assembly according to the present invention; FIG. 2 is a first schematic three-dimensional exploded diagram of an embodiment of an electronic device assembly according to the present invention; FIG. 3 is a second schematic three-dimensional exploded diagram of an embodiment of an electronic device assembly according to the present invention; and FIG. 4 is a schematic cross-sectional view drawn along a division line 4-4 in FIG. 1.

The present invention provides an electronic device assembly, including a plurality of overlapping electronic devices E. The electronic devices E include cases H and electronic components A, each of the cases H has an accommodating space S, the electronic components A are assembled in the accommodating space S of each of the cases H, and the electronic components A in adjacent cases H are assembled in an overlapping manner in the two cases H and can be electrically connected to each other. Therefore, the electronic device assembly may use the accommodating spaces S of the plurality of electronic devices E without external wiring to increase a quantity and types of assembled electronic components A, thereby satisfying diversified electronic function expansion.

Referring to FIG. 4, in the electronic device assembly, the cases H and different electronic components A arranged inside the cases may be matched and combined into electronic devices E with different function orientations. The electronic components A may be circuit boards, connectors, storage elements, or power supply elements with different function orientations.

Referring to FIG. 1, in some embodiments, the electronic device assembly includes two electronic devices E, where each of the electronic devices E includes a case H. An example in which the two electronic devices E are respectively an expansion component E1 and a host E2 is used below for description, but the present invention is not limited thereto.

Referring to FIG. 4, for clear description, in some embodiments in which the electronic device assembly includes the two electronic devices E, the cases H include a first case H1 and a second case H2, where the first case H1 includes a first accommodating space S1, the second case H2 includes a second accommodating space S2, the first case H1 is a part of the expansion component E1, and the second case H2 is a part of the host E2.

Referring to FIG. 4, the electronic device assembly includes the expansion component E1 and the host E2. The expansion component E1 includes the first accommodating space S1, the host E2 includes the second accommodating space S2, and different electronic components A are respectively arranged in the first accommodating space S1 and the second accommodating space S2. When the host E2 is assembled to the expansion component E1, one surface of the expansion component E1 abuts against and is electrically connected to one surface of the host E2, to increase spaces of the electronic device assembly for assembling the electronic components A and functions that can be provided by the electronic device assembly.

Referring to FIG. 3 and FIG. 4, in some embodiments, the electronic components A include a first circuit board A1 and a first connector A2 arranged in the first accommodating space S1 of the expansion component E1 and a main circuit board A3 and a main connector A4 arranged in the second accommodating space S2 of the host E2. In the embodiments, the main circuit board A3 may be a main board, and the first circuit board A1 is various expansion circuit boards that can cooperate with the main board, but the present invention is not limited thereto.

Referring to FIG. 3 and FIG. 4, in the embodiments, the expansion component E1 includes the first case H1, the first circuit board A1, and at least one first connector A2. The first case H1 includes a top plate H11 and a bottom plate H12 that are opposite to each other, where the first accommodating space S1 is formed between the top plate H11 and the bottom plate H12, and the top plate H11 is provided with an opening H111. The first circuit board A1 is arranged in the first accommodating space S1. The first connector A2 is electrically connected to the first circuit board A1, and the first connector A2 is exposed from the top plate H11 at the opening H111. It should be noted that as shown in FIG. 3, the opening H111 is further equipped with a plate that corresponds to a contour shape of the opening H111, and a through hole for the first connector A2 to pass through is provided on the plate, to prevent external water vapor or dust from entering the first case H1 at the opening H111. However, the opening H111 may not be provided with the plate, so that different electronic components A in the first case H1 pass through the opening H111. The present invention is not limited thereto.

Referring to FIG. 3 and FIG. 4, the host E2 includes the second case H2, the main circuit board A3, and at least one main connector A4. The second case H2 includes a first surface H21 and a second surface H22 that are opposite to each other, where the second accommodating space S2 is formed between the first surface H21 and the second surface H22. The main circuit board A3 is arranged in the second accommodating space S2. The main connector A4 is electrically connected to the main circuit board A3 and exposed from the second surface H22. After the host E2 is assembled to the expansion component E1, the second surface H22 of the second case H2 covers the top plate H11 of the first case H1 and the opening H111, and the first connector A2 is electrically connected to the main connector A4.

Therefore, the main circuit board A3 of the host E2 is electrically connected to the first connector A2 of the expansion component E1 by the main connector A4, so that the host E2 can be electrically connected to the first circuit board A1 inside the expansion component E1, to provide function expansion, and the first accommodating space S1 and the second accommodating space S2 are used together to increase the quantity and the types of assembled electronic components A, thereby providing more diversified functions and satisfying more diverse usage demands.

Referring to FIG. 1 to FIG. 4, in some embodiments, the case H (that is, the first case H1) of the expansion component E1 and the case H (that is, the second case H2) of the host E2 are six-sided cubic structures with corresponding appearance shapes. In the embodiments, the first case H1 further includes a first side edge H13, a second side edge H14, a third side edge H15, and a fourth side edge H16 that are sequentially connected, where the first side edge H13, the second side edge H14, the third side edge H15, and the fourth side edge H16 are respectively connected to the top plate H11 and the bottom plate H12 to form the first accommodating space S1. In the embodiments, a shape and a size of the second surface H22 of the case H (the second case H2) of the host E2 correspond to shapes and sizes of the top plate H11 and the bottom plate H12 of the first case H1, so that after the expansion component E1 and the host E2 are assembled, the expansion component and the host have flush outer contours and have an integrated appearance. In addition, a position of the first connector A2 on the top plate H11 corresponds to a position of the main connector A4 on the second surface H22. In this way, when the expansion component E1 and the host E2 are assembled in an overlapping manner, the first connector A2 can be electrically connected to the main connector A4, to achieve expansion.

Referring to FIG. 4, in some embodiments, the expansion component E1 further includes a partition 10, where the partition 10 is parallel to the top plate H11 and the bottom plate H12 and is arranged in the first accommodating space S1. In this way, the partition 10 is located between the top plate H11 and the bottom plate H12 and can divide the first accommodating space S1 into an upper compartment S11 and a lower compartment S12. Therefore, electronic components A with different function orientations may be respectively arranged in the upper compartment S11 and the lower compartment S12, to provide more diversified functional expansion.

Referring to FIG. 4, in some embodiments, the electronic components A further include a second circuit board A5, a plurality of batteries A6, and a second connector A7. In the embodiments, the first circuit board A1 is arranged in the upper compartment S11 of the expansion component E1, the second circuit board A5 and the batteries A6 are arranged in the lower compartment S12 and are electrically connected to each other, and the second connector A7 penetrates the partition 10 and is electrically connected to the first circuit board A1 and the second circuit board A5. Therefore, the main circuit board A3, the first circuit board A1, and the second circuit board A5 may be configured in the electronic device assembly, to provide diversified functional expansion. In addition, the main circuit board A3 is electrically connected to the first circuit board A1, and the first circuit board A1 is electrically connected to the second circuit board A5 and the batteries A6, so that the batteries A6 arranged in the first accommodating space S1 can simultaneously supply power to the electronic components A in the first accommodating space S1 and the second accommodating space S2 without assembling the battery A6 in the second accommodating space S2, to improve a degree of freedom in space utilization of the second accommodating space S2. It should be noted that the first circuit board A1 and the second circuit board A5 may be replaced with circuit boards with different function orientations according to usage requirements, for example, bus circuit boards, display cards, network cards, or redundant array of independent disks (RAID) cards, but the present invention is not limited thereto.

Referring to FIG. 2, in some embodiments, the expansion component E1 further includes a waterproof member 20, where the waterproof member 20 is arranged around the opening H111. Therefore, it is ensured that the external water vapor cannot enter the first accommodating space S1 from the opening H111 of the expansion component E1, to ensure waterproofness of the expansion component E1.

Figure 5:
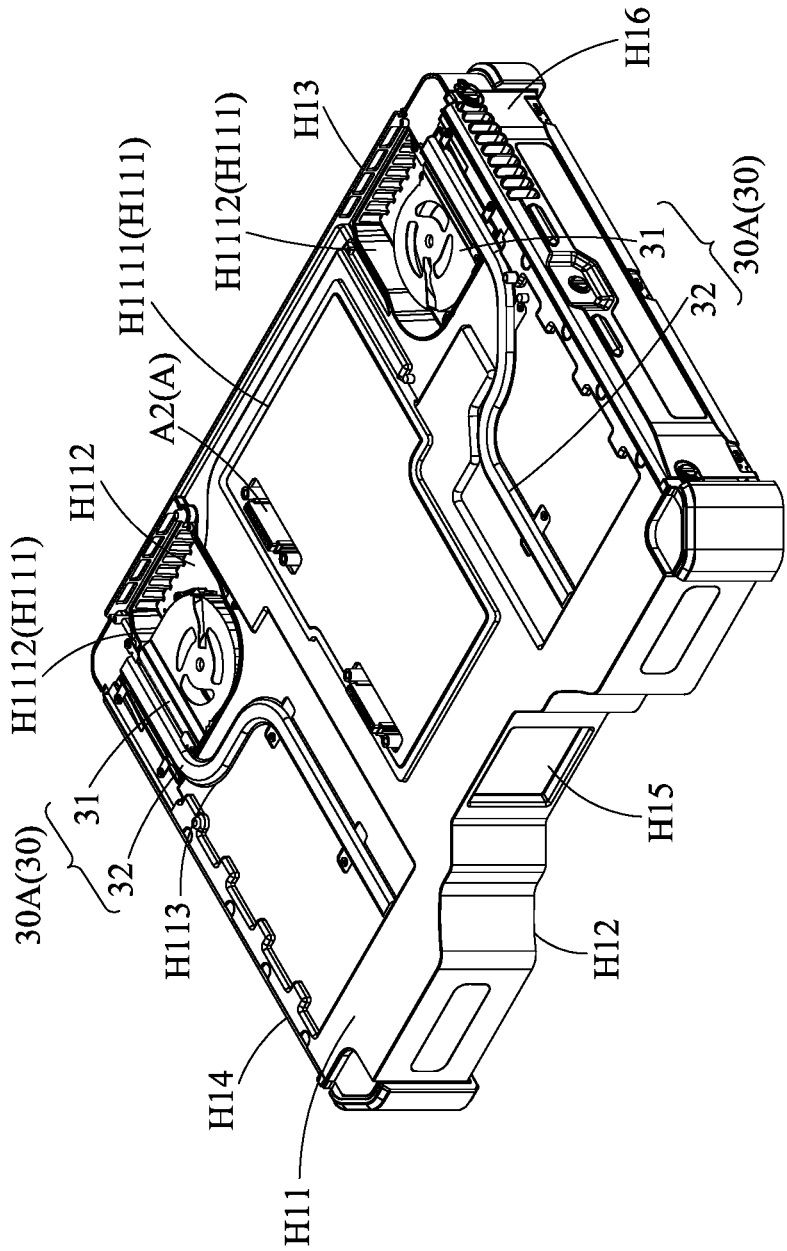
FIG. 5 is a schematic three-dimensional external view of an embodiment of an expansion component in an electronic device assembly according to the present invention.

Referring to FIG. 5, in some embodiments, there are a plurality of openings H111 of the first case H1. In the embodiments, the openings H111 include a first opening H1111 and a second opening H1112, where the first opening H1111 is located in the middle of the top plate H11. Therefore, the middle of the top plate H11 is not limited to a centroid position of the top plate H11, and the middle of the top plate H11 means that an outer contour of the first opening H1111 does not abut against any one of the first side edge H13, the second side edge H14, the third side edge H15, and the fourth side edge H16. In the embodiments, the first connector A2 is exposed from the first opening H1111.

Figure 6:
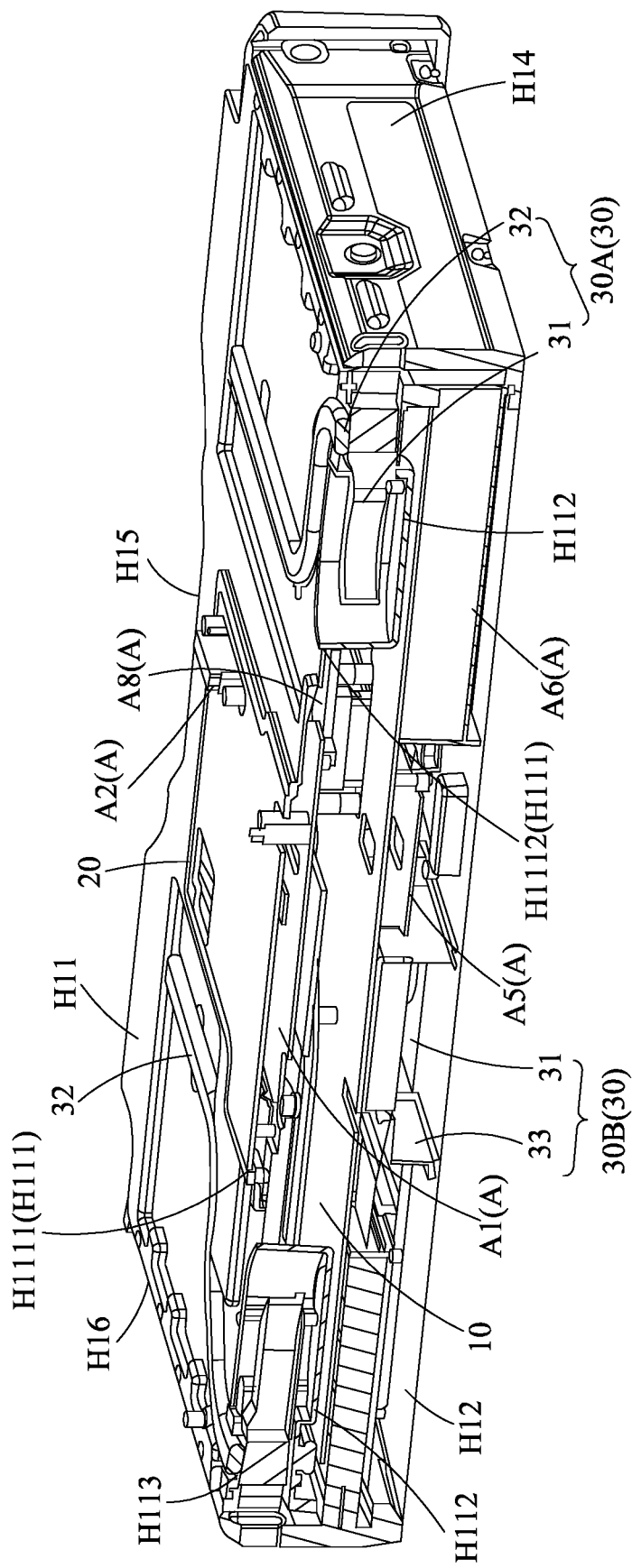
FIG. 6 is a schematic cross-sectional view drawn along a division line 6-6 in FIG. 2.

Referring to FIG. 5 and FIG. 6, the expansion component E1 of the electronic device assembly further includes a heat dissipation module 30, to dissipate heat for the electronic components A in the expansion component. In some embodiments, the heat dissipation module 30 includes a first heat dissipation module 30A and a second heat dissipation module 30B, where the first heat dissipation module 30A is arranged close to the top plate H11 (as shown in FIG. 5), and the second heat dissipation module 30B is arranged close to the bottom plate H12 (as shown in FIG. 6). Therefore, heat dissipation is fully performed inside the expansion component E1 through the heat dissipation module 30. It should be noted that the first heat dissipation module 30A or the second heat dissipation module 30B may be separately arranged in the expansion component E1, or the first heat dissipation module 30A and the second heat dissipation module 30B may be simultaneously arranged. The present invention is not limited thereto.

Referring to FIG. 5, in some embodiments, the first heat dissipation module 30A includes a fan 31 and a heat dissipation pipe 32, the top plate H11 of the first case H1 further includes an assembly groove H112, and the second opening H1112 is adjacent to any two adjacent side edges of the first side edge H13, the second side edge H14, the third side edge H15, and the fourth side edge H16. Referring to FIG. 5, the second opening H1112 is adjacent to the first side edge H13 and the second side edge H14, and the assembly groove H112 is located at a position corresponding to the second opening H1112 and is recessed from the top plate H11 to the bottom plate H12.

Referring to FIG. 5 and FIG. 6, in the embodiments, the fan 31 of the first heat dissipation module 30A is assembled in the assembly groove H112, one end of the heat dissipation pipe 32 corresponds to a position of the fan 31, and an other end of the heat dissipation pipe extends to the top plate H11 and corresponds to positions of the electronic components A inside the expansion component E1. Therefore, the heat dissipation pipe 32 can absorb heat generated by the electronic components A inside the expansion component E1 and conduct the heat to the position corresponding to the fan 31 for heat dissipation.

Referring to FIG. 5 and FIG. 6, in some embodiments, the top plate H11 of the expansion component E1 further includes a heat dissipation pipe groove H113, where the heat dissipation pipe groove H113 is recessed from the top plate H11 to the bottom plate H12, one end of the heat dissipation pipe groove H113 is engaged with the second opening H1112, and an other end of the heat dissipation pipe groove extends to the positions of the electronic components A in the expansion component E1. Therefore, even if the top plate H11 of the expansion component E1 is equipped with the heat dissipation pipe 32, because the heat dissipation pipe 32 is accommodated in the heat dissipation pipe groove H113, surface flatness can still be maintained, thereby ensuring that the host E2 can be smoothly assembled to the expansion component E1.

Referring to FIG. 4 and FIG. 6, in some embodiments, the electronic components A of the electronic device assembly further include disk arrays A8. In the embodiments, the disk arrays A8 are accommodated in the upper compartment S11 of the expansion component E1 and is electrically connected to the first circuit board A1, and the disk arrays A8 are located between the assembly groove H112 and the third side edge H15. Herein, the heat dissipation pipe 32 extends between the assembly groove H112 and the third side edge H15 to correspond to a position of the disk array A8, so as to fully dissipate heat for the disk array A8.

Referring to FIG. 4 and FIG. 6, in some embodiments, there are two disk arrays A8. In the embodiments, a quantity of second openings H1112 of the top plate H11 and a quantity of first heat dissipation modules 30A are equal to a quantity of disk arrays A8. In the embodiments, the two disk arrays A8 are respectively assembled on two sides of the first circuit board A1 (where one group of disk arrays A8 is displayed in FIG. 4), one second opening H1112 is adjacent to the first side edge H13 and the second side edge H14, the other second opening H1112 is adjacent to the first side edge H13 and the fourth side edge H16, and a heat dissipation pipe 32 of each first heat dissipation module 30A extends between the third side edge H15 and the two second openings H1112. Therefore, the first heat dissipation modules 30A can dissipate heat for the two disk arrays A8 accommodated in the upper compartment S11.

Figure 7:
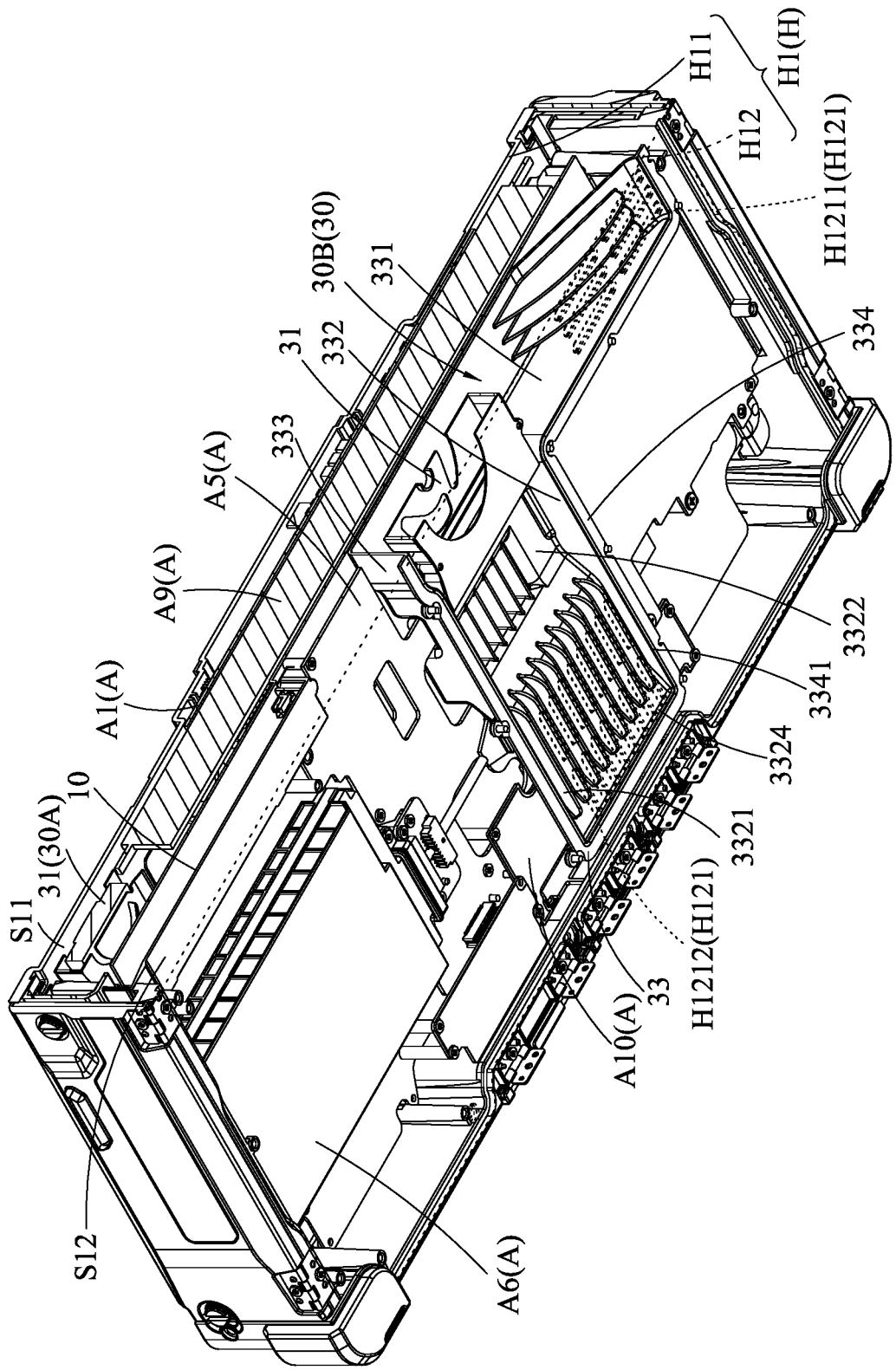
FIG. 7 is a schematic cross-sectional view drawn along a division line 7-7 in FIG. 3.
Figure 8:
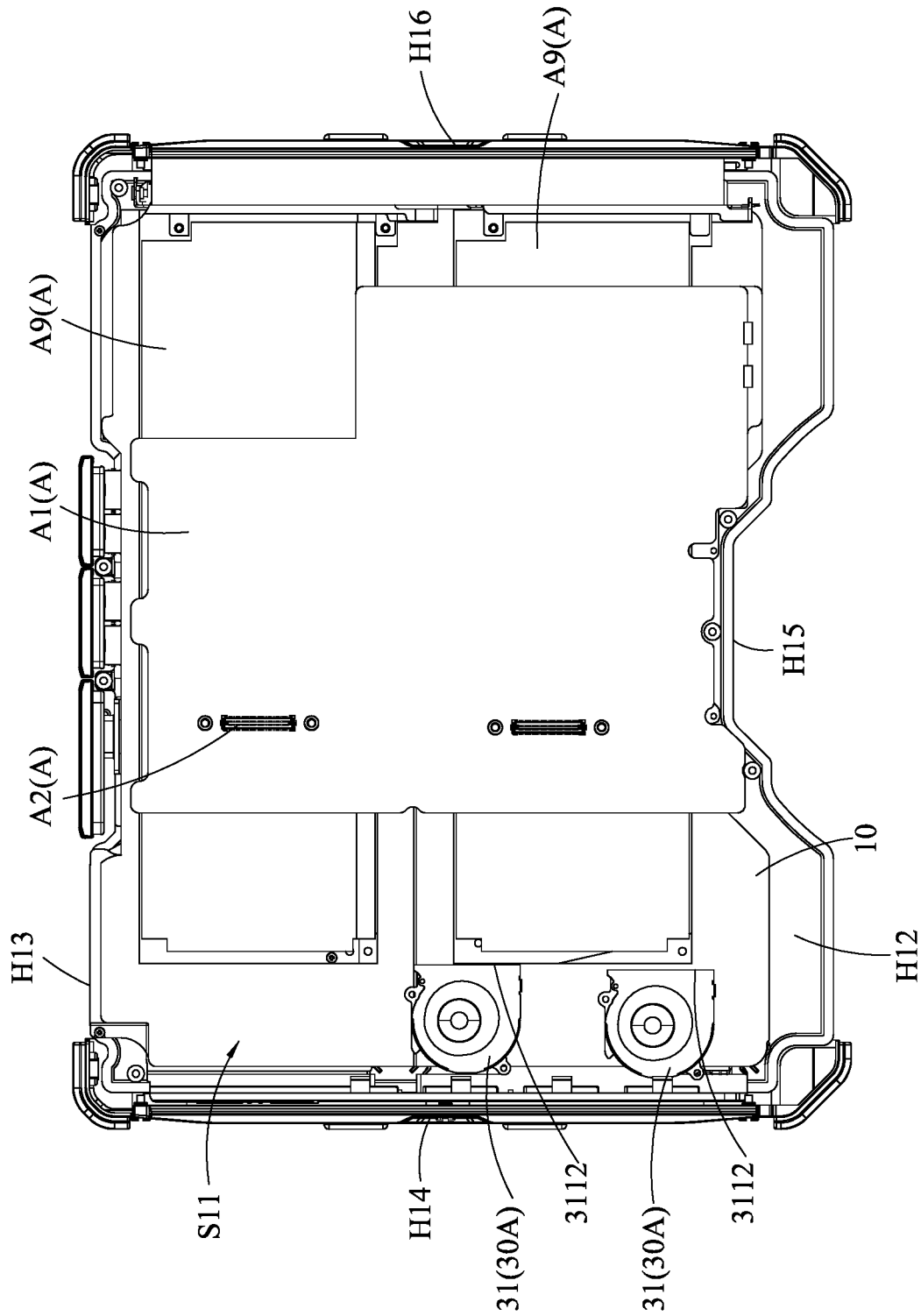
FIG. 8 is a schematic diagram of a partial structure of an embodiment of an expansion component according to the present invention.

Referring to FIG. 7 and FIG. 8, FIG. 7 is a schematic cross-sectional view drawn along a division line 7-7 in FIG. 3. FIG. 8 is a schematic diagram of a partial structure of an embodiment of an expansion component according to the present invention. FIG. 8 is a schematic diagram in which configurations inside an upper compartment S11 are exposed without displaying a top plate H11 in a first case H1. In the embodiments, the electronic component A accommodated in the upper compartment S11 in the electronic device assembly and electrically connected to the first circuit board A1 is a bus apparatus A9 (for example, a PCI-E card, a PCI-E interface display card, a PCI-E interface SSD, or another PCI-E interface high-speed signal transmission apparatus). In the embodiments, the first heat dissipation module 30A includes the fan 31 that is accommodated in the upper compartment S11. Herein, the fan 31 is electrically connected to the first circuit board A1, the fan 31 is provided with an air outlet 3112, and the air outlet 3112 of the fan 31 faces toward the bus apparatus A9 to dissipate heat for the bus apparatus A9.

Figure 9:
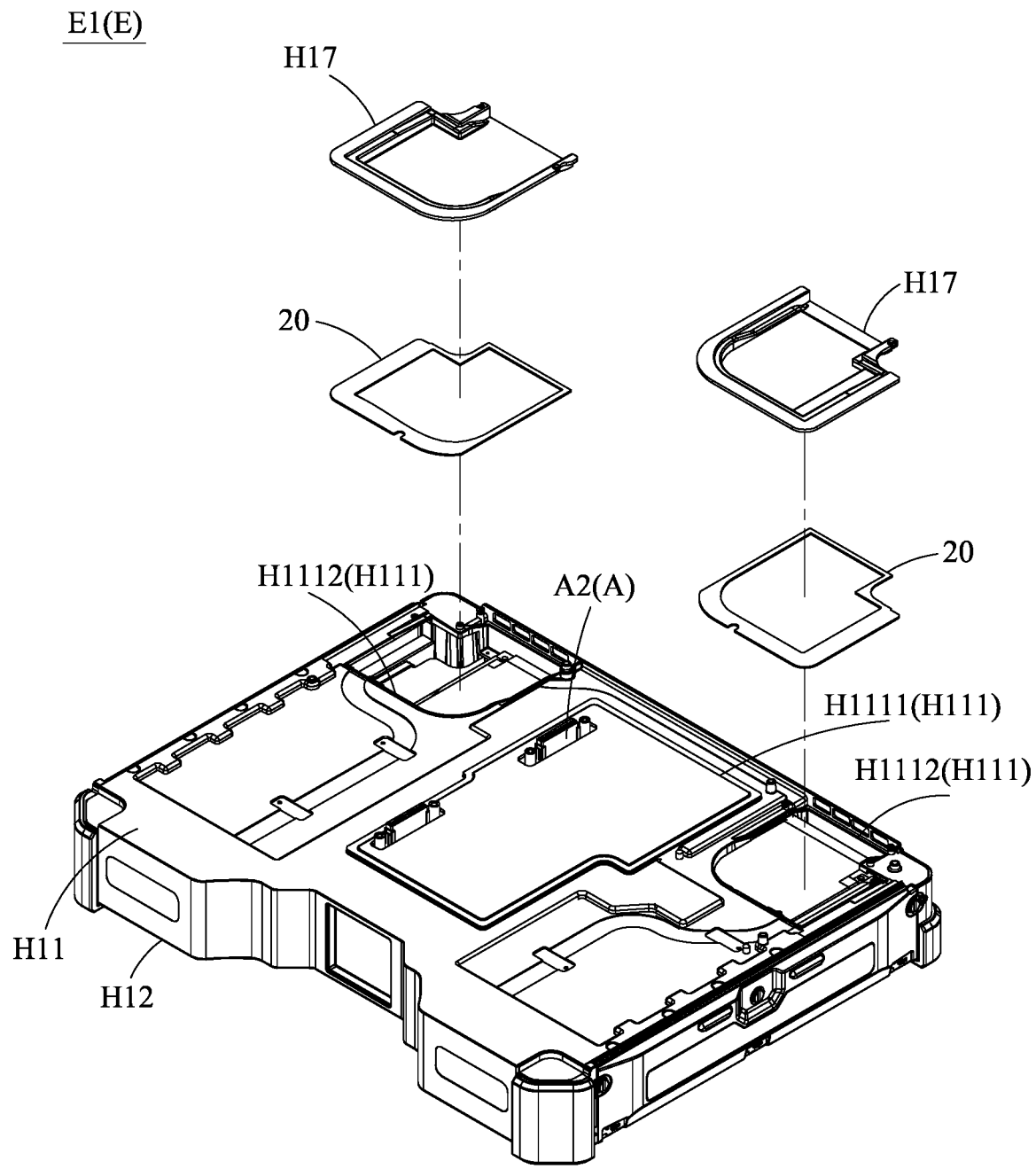
FIG. 9 is a first schematic exploded view of a partial structure of another embodiment of an expansion component according to the present invention.

Referring to FIG. 8 and FIG. 9, in some embodiments in which the first heat dissipation module 30A is accommodated in the upper compartment S11 rather than arranged at the second opening H1112, the first case H1 does not include the assembly groove H112. In the embodiments, the first case H1 further includes a waterproof cover plate H17, where a shape and a size of the waterproof cover plate H17 corresponds to the shape and the size of the second opening H1112, and the waterproof cover plate H17 covers the second opening H1112, to close the second opening H1112, thereby ensuring waterproofness inside the first case H1.

Figure 10:
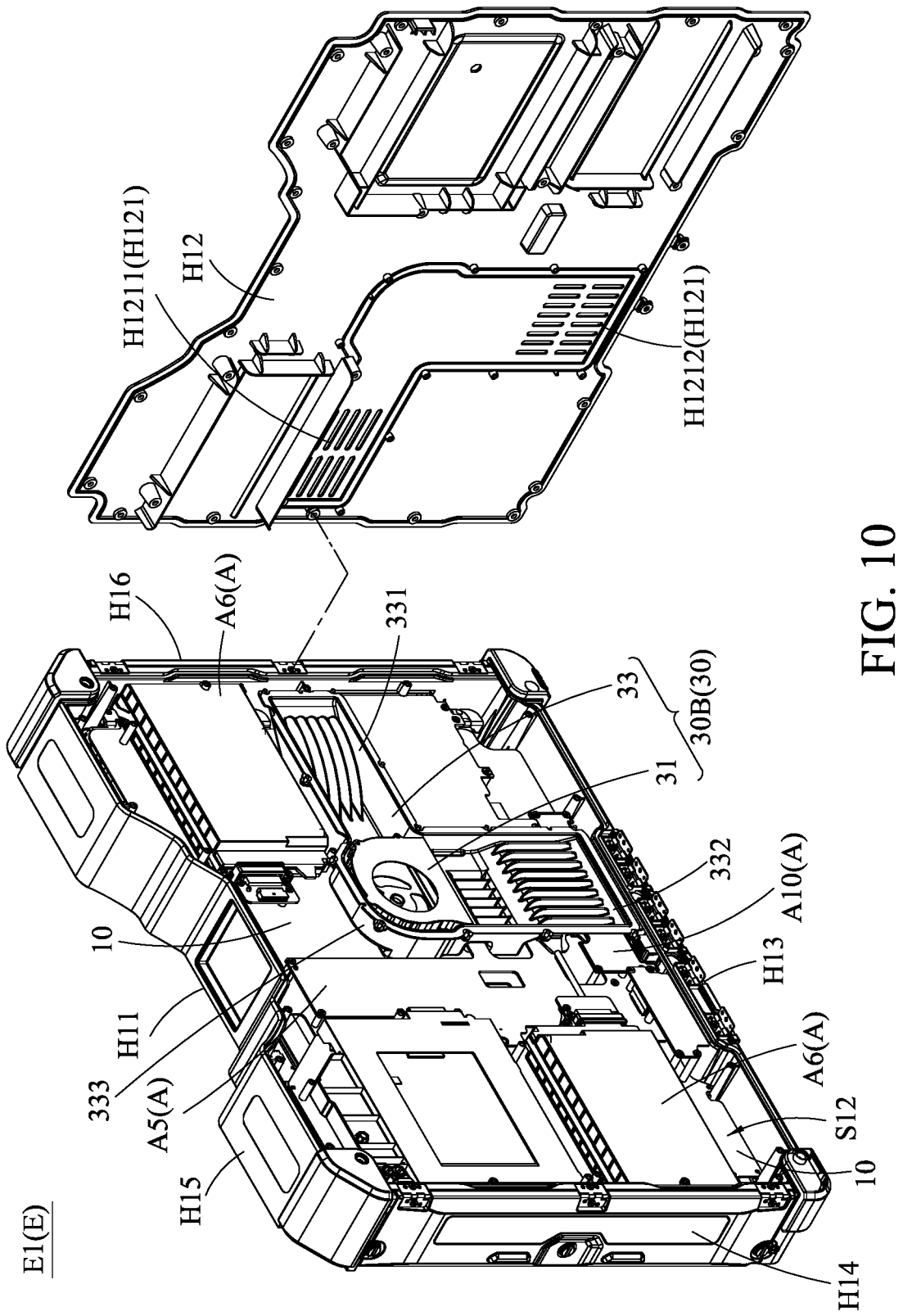
FIG. 10 is a second schematic exploded view of a partial structure of another embodiment of an expansion component according to the present invention.
Figure 11:
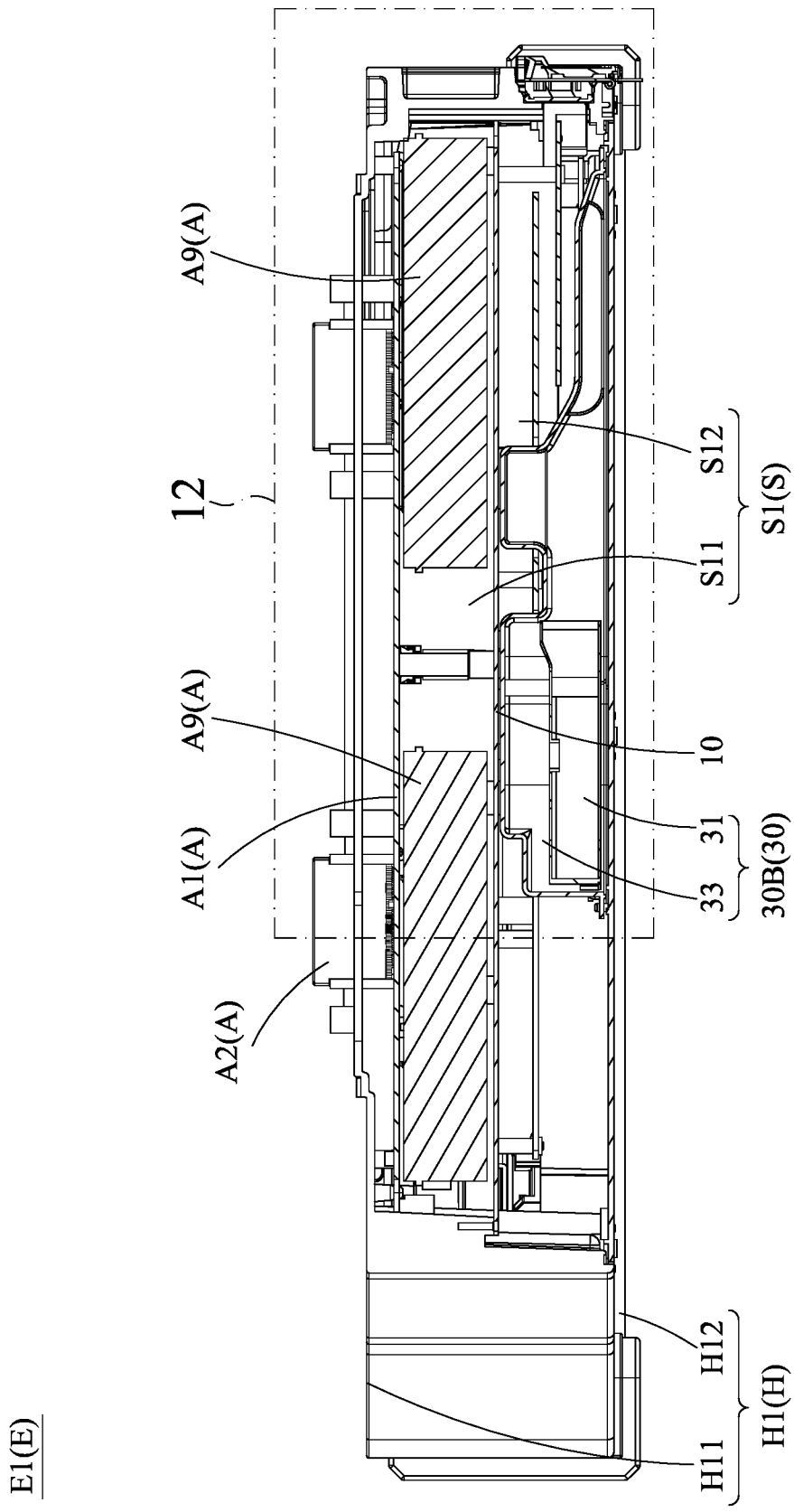
FIG. 11 is a schematic cross-sectional view drawn along a division line 11-11 in FIG. 2.
Figure 12:
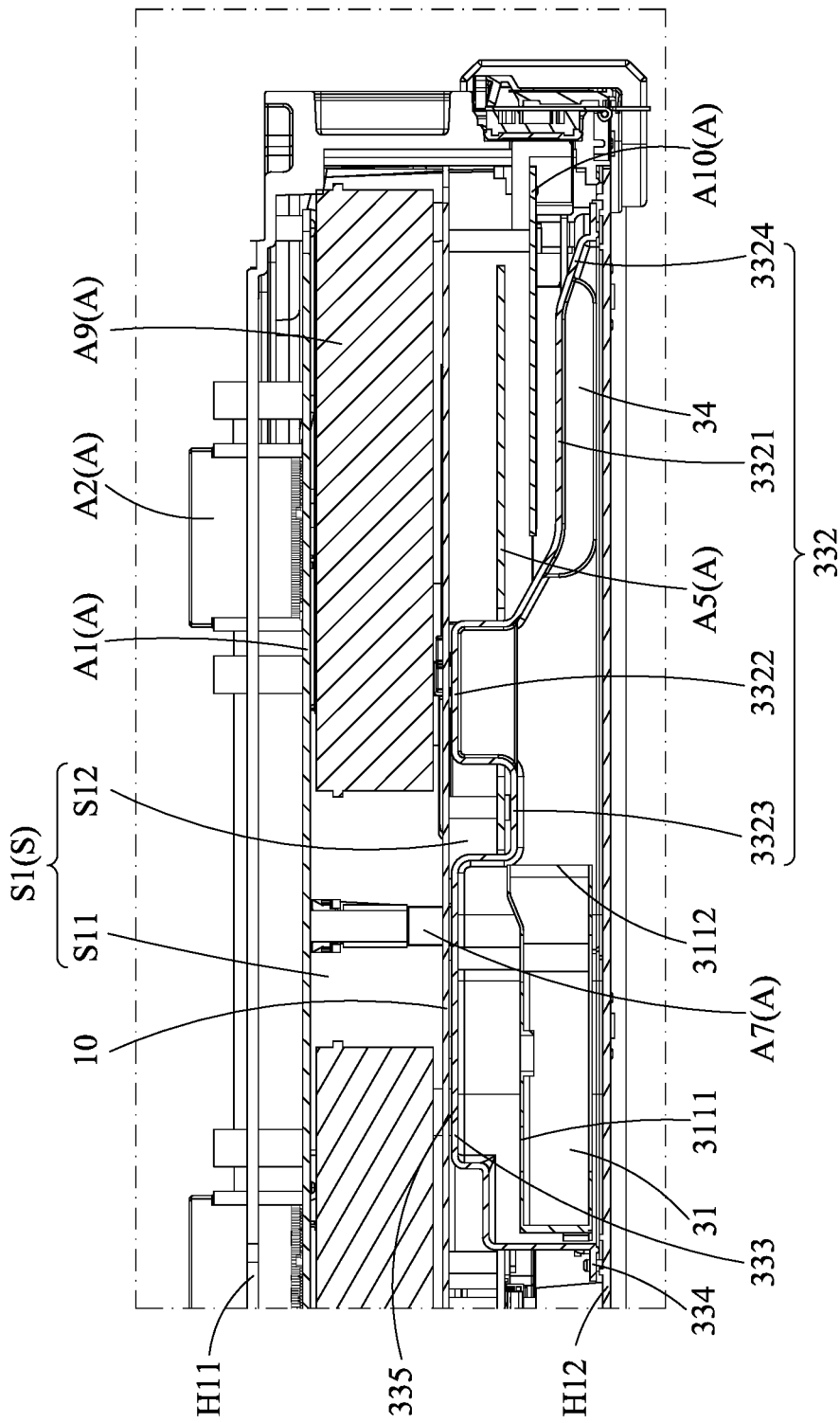
FIG. 12 is a schematic partial enlarged view of a circle 12 in FIG. 11.

Referring to FIG. 10 to FIG. 12, in some embodiments, the second heat dissipation module 30B is arranged in the lower compartment S12 and can simultaneously dissipate heat for the electronic components A inside the upper compartment S11 and the lower compartment S12. In the embodiments, the electronic components A accommodated in the upper compartment S11 abut against the partition 10.

Referring to FIG. 10 to FIG. 12, the second heat dissipation module 30B includes the fan 31 and a flow guide case 33. The flow guide case 33 includes an input section 331 and an output section 332 that are connected. An angle is defined between an extending direction of the input section 331 and an extending direction of the output section 332, the flow guide case 33 is accommodated in the lower compartment S12, and the output section 332 abuts against the partition 10 and one of the electronic components A located in the lower compartment S12. The fan 31 is arranged at a junction of the input section 331 and the output section 332.

Therefore, when the fan 31 of the second heat dissipation module 30B runs, an airflow is led into the input section 331 of the flow guide case 33 and then is led out from the output section 332, heat generated by the partition 10 and the electronic component A located in the lower compartment S12 against which the output section 332 abut can be conducted outside the expansion component E1 through the airflow, and heat dissipation can be simultaneously performed on the electronic components A accommodated in the upper compartment S11 and the lower compartment S12 by using the second heat dissipation module 30B, to reduce a space occupied by assembling the heat dissipation structure or the internal diversion device, and improve utilization of the internal space of the electronic device assembly.

Figure 13:
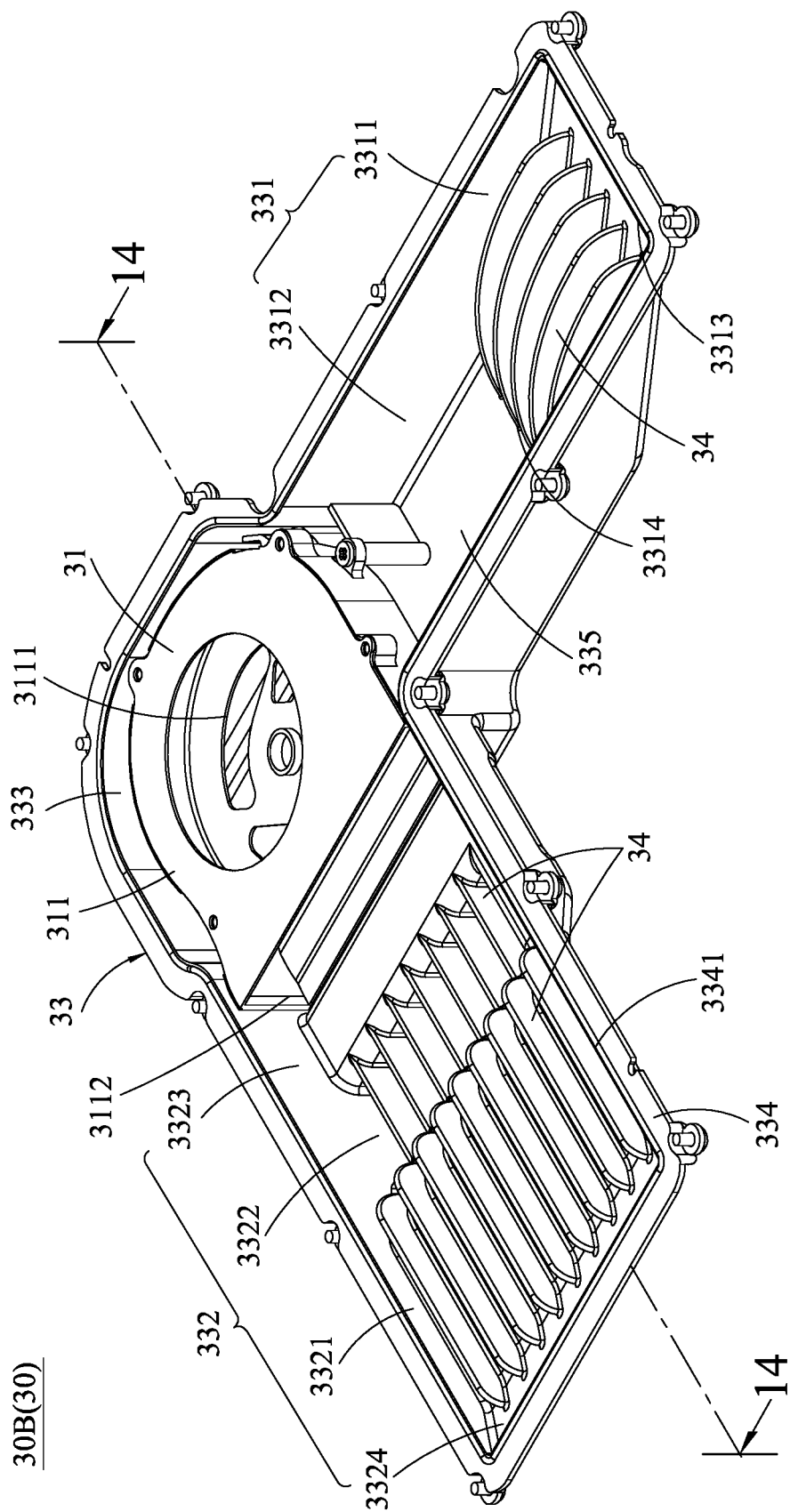
FIG. 13 is a schematic three-dimensional external view of an embodiment of a heat dissipation module in an expansion component according to the present invention.

Referring to FIG. 10 and FIG. 13, in some embodiments, the input section 331 and the output section 332 of the flow guide case 33 are connected to form an L-shape. That is, the angle between the extending direction of the input section 331 and the extending direction of the output section 332 is 90 degrees. Therefore, a position at which the second heat dissipation module 30B introduces the airflow and a position at which the airflow is led out for heat dissipation are not on a same straight line but can meet position configuration requirements of different electronic components A inside the lower compartment S12.

Referring to FIG. 10 and FIG. 13, in some embodiments, the flow guide case 33 includes a connecting section 333, where the connecting section 333 is located between the input section 331 and the output section 332, and the fan 31 is accommodated in the connecting section 333. In the embodiments, an end of the input section 331 away from the connecting section 333 and an end of the output section 332 away from the connecting section are respectively inclined relative to the connecting section 333. Therefore, depths may be configured for a part between the connecting section 333 and the input section 331 and a part between the output section 332 and the connecting section 333 for collecting and guiding an airflow, and the end of the input section 331 away from the connecting section 333 and the end of the output section 332 away from the connecting section may be close to an assembled position of the flow guide case 33, to smoothly guide input and output of the airflow.

Referring to FIG. 10 and FIG. 13, in some embodiments, the entire flow guide case 33 includes an edge 334, the edge 334 surrounds and forms an opening 3341, and the input section 331, the output section 332, and the connecting section 333 are located within a range of the opening 3341. In the embodiments, the bottom plate H12 of the first case H1 of the expansion component E1 includes a plurality of through holes H121. The edge 334 of the flow guide case 33 abuts against the bottom plate H12 of the first case H1, and the opening 3341 covers the through hole H121. Therefore, the airflow can be smoothly inputted into the flow guide case 33 from the bottom plate H12 of the first case H1 and outputted from the flow guide case 33, to ensure a diversion effect and a heat dissipation effect of the flow guide case 33.

Referring to FIG. 7 and FIG. 10, in some embodiments, the through holes H121 of the bottom plate H12 of the first case H1 include a plurality of first through holes H1211 and a plurality of second through holes H1212. Positions of the first through holes H1211 correspond to a position of the input section 331, and positions of the second through holes H1212 correspond to a position of the output section 332, to ensure smoothness of the airflow flowing in and out of the flow guide case 33.

Figure 14:
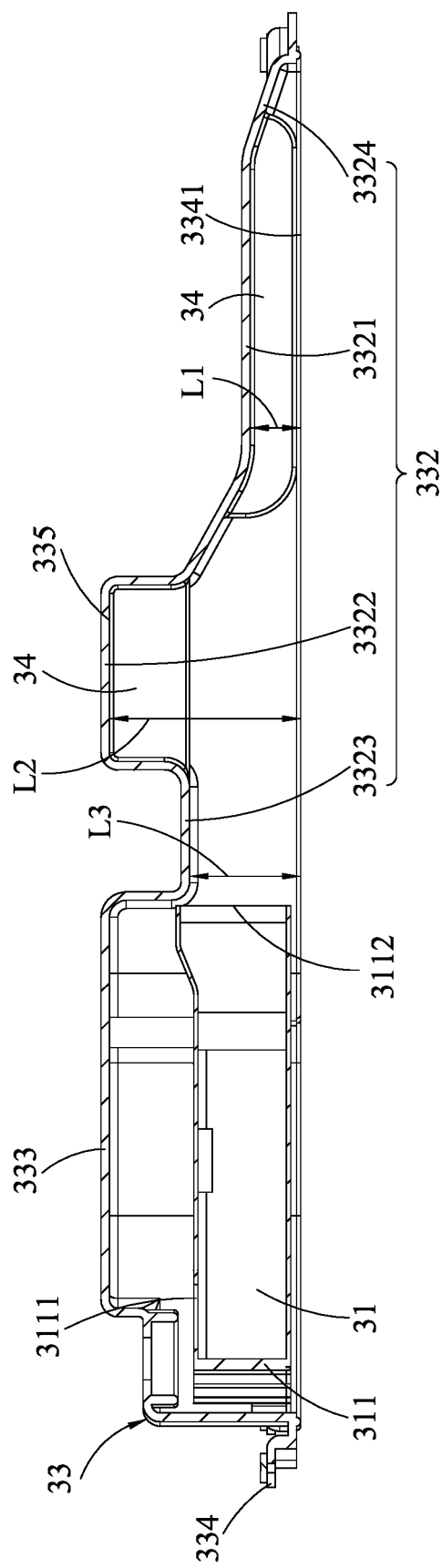
FIG. 14 is a schematic cross-sectional view drawn along a division line 14-14 in FIG. 13.

Referring to FIG. 12 to FIG. 14, in some embodiments, the flow guide case 33 includes an inner surface 335. When the flow guide case 33 is assembled on the bottom plate H12 of the first case H1, the inner surface 335 faces toward the bottom plate H12, and the inner surface 335 has different depth configurations to be attached to different electronic components A, so as to dissipate heat for a plurality of electronic components A simultaneously. In the embodiments, the output section 332 includes a first heat dissipation section 3321 and a second heat dissipation section 3322. The inner surface 335 has a first height L1 between the first heat dissipation section 3321 and the opening 3341, the inner surface 335 has a second height L2 between the second heat dissipation section 3322 and the opening 3341, and the first height L1 is different from the second height L2. Therefore, the flow guide case 33 may be simultaneously in contact with the electronic components A located inside the lower compartment S12 and the upper compartment S11 through the first heat dissipation section 3321 and the second heat dissipation section 3322 and can simultaneously dissipate heat for the electronic components A located inside the upper compartment S11 and the lower compartment S12.

Referring to FIG. 12 and FIG. 14, in the embodiments, the first height L1 is less than the second height L2, that is, a distance of the inner surface 335 between the first heat dissipation section 3321 and the opening 3341 is less than a distance of the inner surface 335 between the second heat dissipation section 3322 and the opening 3341, and the first heat dissipation section 3321 is closer to the bottom plate H12 than the second heat dissipation section 3322. Therefore, the first heat dissipation section 3321 of the flow guide case 33 abuts against the electronic component A located in the lower compartment S12, the second heat dissipation section 3322 abuts against the partition 10, and a position of the second heat dissipation section 3322 corresponds to the position of the electronic component A located in the upper compartment S11.

Referring to FIG. 12, in the embodiments in which the electronic component A located in the upper compartment S11 is the bus apparatus A9, the bus apparatus A9 abuts against the partition 10, and the second heat dissipation section 3322 of the flow guide case 33 abuts against a position at which the partition 10 corresponds to the bus apparatus A9 to dissipate heat for the bus apparatus A9. In the embodiments, the electronic components A of the expansion component E1 further include a third circuit board A10, where the third circuit board A10 is arranged in the lower compartment S12 and is parallel to and spaced apart from the second circuit board A5, and the third circuit board A10 is closer to the bottom plate H12 than the second circuit board A5. Herein, the first heat dissipation section 3321 of the flow guide case 33 abuts against the third circuit board A10 to dissipate heat for the third circuit board A10. Therefore, a plurality of overlapping electronic components A may be configured in the lower compartment S12 of the expansion component E1, and heat of the overlapping electronic components A can still be fully dissipated by the second heat dissipation module 30B, to ensure that the electronic components A can smoothly run, thereby ensuring an expansion function of the expansion component E1.

Referring to FIG. 12 to FIG. 14, in some embodiments, the output section 332 of the flow guide case 33 further includes a third heat dissipation section 3323, where the first heat dissipation section 3321, the second heat dissipation section 3322, and the third heat dissipation section 3323 of the output section 332 are sequentially connected, and the third heat dissipation section 3323 of the output section 332 is connected to the fan 31. Therefore, air enters from the input section 331 of the flow guide case 33, then enters the fan 31, and then is discharged sequentially by the third heat dissipation section 3323, the second heat dissipation section 3322, and the first heat dissipation section 3321 of the output section 332. In this way, the heat of all the electronic components A abutting against the first heat dissipation section 3321, the second heat dissipation section 3322, and the third heat dissipation section 3323 can be dissipated by the flow guide case 33.

Referring to FIG. 12 to FIG. 14, in some embodiments, the inner surface 335 of the flow guide case 33 has a third height L3 between the third heat dissipation section 3323 and the opening 3341, where the third height L3 is different from the first height L1 and the second height L2. Therefore, the electronic components A against which the first heat dissipation section 3321, the second heat dissipation section 3322, and the third heat dissipation section 3323 abut for heat dissipation may be respectively located at different height positions but can still be fully dissipated by the flow guide case 33. In the embodiments, the third heat dissipation section 3323 abuts against the second circuit board A5, but the present invention is not limited thereto.

Referring to FIG. 12 to FIG. 14, in some embodiments, the fan 31 is a centrifugal fan and includes a case 311, where the case 311 is provided with an air inlet 3111 and an air outlet 3112 that are perpendicular to each other. The third heat dissipation section 3323 of the output section 332 of the flow guide case 33 is flush with the air outlet 3112 of the fan 31. Therefore, an airflow outputted from the air outlet 3112 of the fan 31 can smoothly enter the output section 332 from the third heat dissipation section 3323, to improve smoothness of the airflow.

Referring to FIG. 12 to FIG. 14, in the embodiments in which the third heat dissipation section 3323 of the flow guide case 33 is flush with the fan 31, the third height L3 is greater than the first height L1 and is less than the second height L2. Therefore, a large amount of air entering the output section 332 from the fan 31 can be collected at the second heat dissipation section 3322 after passing through the third heat dissipation section 3323, to obviously dissipate heat for the electronic component A at a position corresponding to the partition 10, and then is discharged by the first heat dissipation section 3321 closest to the bottom plate H12.

Referring to FIG. 12 to FIG. 14, in some embodiments, the input section 331 of the flow guide case 33 includes an inlet section 3311 and a collecting section 3312 that are sequentially connected, where the collecting section 3312 is connected between the inlet section 3311 and the connecting section 333 and is flush with the connecting section 333. In the embodiments, the fan 31 is arranged in the connecting section 333 and the air inlet 3111 faces toward the inner surface 335, and a distance is provided between the air inlet 3111 of the fan 31 and the inner surface 335. Therefore, air can enter the fan 31 after being guided by the input section 331 of the flow guide case 33 for the fan 31 to generate an active airflow.

Referring to FIG. 12 to FIG. 14, in some embodiments, the inner surface 335 of the flow guide case 33 also has the second height L2 from the opening 3341 at the position of the collecting section 3312 and the connecting section 333. Therefore, the collecting section 3312 can collect a large amount of air introduced by the inlet section 3311 into the fan 31, so as to improve a flow rate of air flowing through the flow guide case 33 and the heat dissipation efficiency. In addition, because the connecting section 333 also has the second height L2, when the flow guide case 33 is assembled in the lower compartment S12, the connecting section 333 can also abut against the partition 10, to increase an area where the partition 10 abuts against the flow guide case 33, thereby improving a support force of the partition 10 and also improving heat dissipation effect for the electronic components A abutting against the partition 10.

Referring to FIG. 12 to FIG. 14, in some embodiments, the second heat dissipation module 30B further includes a plurality of heat dissipation fins 34, where the heat dissipation fins 34 are arranged in the flow guide case 33. In the embodiments, the plurality of heat dissipation fins 34 are respectively arranged in the first heat dissipation section 3321, the second heat dissipation section 3322, and the inlet section 3311 of the flow guide case 33, and the heat dissipation fins 34 in the first heat dissipation section 3321, the second heat dissipation section 3322, and the inlet section 3311 are parallel to and spaced apart from each other. Therefore, a contact area between the air and the flow guide case 33 is increased, to improve the heat dissipation effect.

Referring to FIG. 12 to FIG. 14, in some embodiments, the inlet section 3311 of the input section 331 of the flow guide case 33 has a first end 3313 and a second end 3314, where the second end 3314 is closer to the fan 31 than the first end 3313 and is connected to the fan 31, a height of the inner surface 335 from the second end 3314 to the opening 3341 is greater than a height of the inner surface from the first end 3313 to the opening 3341, and the first end 3313 is obliquely connected to the second end 3314, so that the inlet section 3311 is inclined to the bottom plate H12. In this way, the inlet section 3311 obliquely extends to the bottom plate H12, and air is introduced by the first through hole H1211 of the bottom plate H12, to improve the smoothness of the air entering the flow guide case 33.

Referring to FIG. 12 to FIG. 14, in some embodiments, the output section 332 of the flow guide case 33 further includes an outlet section 3324, where the outlet section 3324 is connected to the first heat dissipation section 3321 and is inclined to the first heat dissipation section 3321, so that the outlet section 3324 obliquely extends to the bottom plate H12. In this way, the outlet section 3324 obliquely extends to the bottom plate H12, and air is introduced by the second through hole H1212 of the bottom plate H12, to improve the smoothness of the air entering the flow guide case 33.

Referring to FIG. 12 to FIG. 14, in some embodiments, the inner surface 335 of the flow guide case 33 is inclined relative to the bottom plate H12 in an extending direction between the first heat dissipation section 3321 and the second heat dissipation section 3322. Therefore, it is ensured that the air in the second heat dissipation section 3322 farthest from the opening 3341 can smoothly flow to the first heat dissipation section 3321, to ensure the smoothness of the heat dissipation airflow.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An expansion component, comprising:
   a case, comprising a bottom plate, a top plate, and an accommodating space located between the bottom plate and the top plate;
   a partition, arranged in the accommodating space and parallel to the bottom plate, wherein the partition divides the accommodating space into an upper compartment and a lower compartment;
   a plurality of electronic components, scattered in the upper compartment and the lower compartment, wherein one of the electronic components located in the upper compartment abuts against the partition; and
   a heat dissipation module, arranged in the case and comprising:
      a flow guide case, comprising an input section and an output section that are connected, wherein an angle is defined between an extending direction of the input section and an extending direction of the output section, the flow guide case is accommodated in the lower compartment, and the output section abuts against the partition and one of the electronic components located in the lower compartment; and
      a fan, arranged at a junction of the input section and the output section.

2. The expansion component according to claim 1, wherein the bottom plate comprises a plurality of through holes, and the flow guide case comprises an edge, the edge surrounds and forms an opening, the edge abuts against the bottom plate, and the opening covers the through holes.

3. The expansion component according to claim 2, wherein the through holes comprise a plurality of first through holes and a plurality of second through holes, the first through holes correspond to a position of the input section, and the second through holes correspond to a position of the output section.

4. The expansion component according to claim 2, wherein the flow guide case comprises an inner surface, the inner surface faces toward the bottom plate, the output section comprises a first heat dissipation section and a second heat dissipation section, the inner surface has a first height between the first heat dissipation section and the opening, the inner surface has a second height between the second heat dissipation section and the opening, and the first height is different from the second height.

5. The expansion component according to claim 4, further comprising a plurality of heat dissipation fins, arranged on the first heat dissipation section and the second heat dissipation section.

6. The expansion component according to claim 4, wherein the first heat dissipation section abuts against the electronic component located in the lower compartment, and the second heat dissipation section abuts against a position at which the partition corresponds to the electronic component located in the upper compartment.

7. The expansion component according to claim 4, wherein the first heat dissipation section is farther away from the fan than the second heat dissipation section, and the first height is less than the second height.

8. The expansion component according to claim 7, wherein the inner surface is inclined to the bottom plate in an extending direction between the first heat dissipation section and the second heat dissipation section.

9. The expansion component according to claim 4, wherein the output section further comprises a third heat dissipation section, the inner surface has a third height between the third heat dissipation section and the opening, and the third height is different from the first height and the second height.

10. The expansion component according to claim 9, wherein the third heat dissipation section is closer to the fan than the first heat dissipation section and the second heat dissipation section, and the third heat dissipation section abuts against another electronic component located in the lower compartment.

11. The expansion component according to claim 9, wherein the third heat dissipation section is flush with the fan, and the third height is greater than the first height and less than the second height.

12. The expansion component according to claim 4, wherein the input section of the flow guide case comprises an inlet section, the inlet section has a first end and a second end, the inner surface is inclined to the bottom plate at the inlet section, the second end is closer to the fan than the first end, and a height of the inner surface from the second end to the opening is greater than a height of the inner surface from the first end to the opening.

13. The expansion component according to claim 12, further comprising a plurality of heat dissipation fins, arranged on the inlet section.

14. The expansion component according to claim 13, wherein the input section of the flow guide case further comprises a collecting section, the collecting section is located between the inlet section and the fan, the inner surface has the second height from the collecting section to the opening, and the collecting section abuts against the partition.

15. The expansion component according to claim 4, wherein the fan comprises a case, the case is provided with an air inlet and an air outlet that are perpendicular to each other, the air inlet faces toward the inner surface and is spaced apart from the inner surface by a distance, and the air outlet faces toward the output section.

16. The expansion component according to claim 15, wherein the inner surface has the second height from the fan to the opening.

17. The expansion component according to claim 1, wherein the angle is 90 degrees.

* * * * *